(12) United States Patent
Tanaka et al.

(10) Patent No.: US 8,981,323 B2
(45) Date of Patent: Mar. 17, 2015

(54) CHARGED PARTICLE BEAM APPARATUS, AND ARTICLE MANUFACTURING METHOD

(71) Applicant: Canon Kabushiki Kaisha, Tokyo (JP)

(72) Inventors: Ichiro Tanaka, Utsunomiya (JP); Akira Miyake, Nasukarasuyama (JP)

(73) Assignee: Canon Kabushiki Kaisha (JP)

( * ) Notice: Subject to any disclaimer, the term of this patent is extended or adjusted under 35 U.S.C. 154(b) by 0 days.

(21) Appl. No.: 13/771,388

(22) Filed: Feb. 20, 2013

(65) Prior Publication Data

US 2013/0216959 A1   Aug. 22, 2013

(30) Foreign Application Priority Data

Feb. 20, 2012   (JP) ................. 2012-034066

(51) Int. Cl.
  *G21K 5/04*   (2006.01)
  *H01J 37/317*   (2006.01)
  *H01J 37/02*   (2006.01)

(52) U.S. Cl.
  CPC ........... *H01J 37/3174* (2013.01); *H01J 37/026* (2013.01); *H01J 37/3177* (2013.01); *H01J 2237/182* (2013.01)
  USPC ................. 250/492.3; 250/492.1; 250/396 R; 250/397

(58) Field of Classification Search
  USPC ......... 250/305, 306, 307, 308, 309, 310, 311, 250/396 R, 397, 492.1, 492.3
  See application file for complete search history.

(56) References Cited

U.S. PATENT DOCUMENTS

2006/0227306 A1* 10/2006 Hirukawa et al. ............... 355/52
2010/0162782 A1   7/2010 Suzuki

FOREIGN PATENT DOCUMENTS

| JP | 2004-055166 A | 2/2004 |
| JP | 2010-155367 A | 7/2010 |

* cited by examiner

*Primary Examiner* — Nicole Ippolito
(74) *Attorney, Agent, or Firm* — Rossi, Kimms & McDowell LLP

(57) ABSTRACT

A charged particle beam apparatus for processing an object using a charged particle beam includes a charged particle lens in which an array of apertures, through each of which a charged particle beam passes, is formed; a vacuum container which contains the charged particle lens; and a radiation source configured to generate an ionizing radiation; wherein the apparatus is configured to cause the radiation source to pass the ionizing radiation through the array of apertures in a state in which a pressure in the vacuum container is changing.

15 Claims, 4 Drawing Sheets

CHARGED PARTICLE BEAM APPARATUS, AND ARTICLE MANUFACTURING METHOD

BACKGROUND OF THE INVENTION

1. Field of the Invention

The present invention relates to a charged particle beam apparatus and to an article manufacturing method using the apparatus.

2. Description of the Related Art

A rendering apparatus (charged particle beam apparatus) is known that executes rendering on a substrate by controlling blanking and deflection/scanning of a charged particle beam such as an electron beam or the like. The rendering apparatus can be adopted in relation to one pattern formation technique in substitution for a light exposure method for the production or the like of a memory device of 4GDRAM or later that has a line width of 0.1 μm. In this type of rendering apparatus, an electrostatic lens that includes a plurality of electrode layers, and spacers formed from an insulating body that are disposed between the electrodes is used as an electron lens for focusing the electron beam. The electrostatic lens is disposed in the lens barrel that can maintain a constant vacuum state. However, when the internal portion of the lens barrel becomes during exposure to atmosphere (vent) or during evacuation, the insulating body configuring the spacer may become charged and thereby may result in a residual electric potential. For example, the charge on the insulating body during evacuation may have an effect such as causing a curvature in the orbit of the electron beam during rendering processing. Furthermore the electrostatic component of the charge on the insulating body during exposure to atmosphere may attract and cause attachment of particles to the surface of the insulating body. The charge on the insulating body and the charge on the particles both have the potential to cause an effect on the orbit of the electron beam. In order to suppress this type of effect of the charge, Japanese Patent Application Laid-Open No. 2004-55166 discloses a charged particle beam exposure apparatus that includes a shield electrode configured to suppress the charge on the insulating spacer. Furthermore, Japanese Patent Application Laid-Open No. 2010-155367 discloses a vacuum forming apparatus that includes an ionizer (ion supplying unit) that functions as a apparatus to remove electrostatic electricity that is produced during evacuation in the chamber.

However, incorporation of the shield electrode disclosed in Japanese Patent Application Laid-Open No. 2004-55166 into the electron lens is associated with difficulties resulting from the miniaturization of the pattern to be rendered. Furthermore, even when this type of shield electrode is provided, the charge itself is not eliminated. The ionizer in Japanese Patent Application Laid-Open No. 2010-155367 has a disadvantage in relation to the efficiency of charge neutralization since the ions are inhibited from reaching the insulating spacer from the minute aperture of the electron lens.

SUMMARY OF THE INVENTION

The present invention provides, for example, a charge particle beam apparatus that is advantageous for neutralization of a charge of an insulator contained in a charged particle lens.

According to an aspect of the present invention, a charged particle beam apparatus for processing an object using a charged particle beam is provided that includes a charged particle lens in which an array of apertures, through each of which a charged particle beam passes, is formed,; a vacuum container which contains the charged particle lens; and a radiation source configured to generate an ionizing radiation; wherein the apparatus is configured to cause the radiation source to pass the ionizing radiation through the array of apertures in a state in which a pressure in the vacuum container is changing.

Further features of the present invention will become apparent from the following description of exemplary embodiments (with reference to the attached drawings).

BRIEF DESCRIPTION OF THE EMBODIMENTS

The preferred embodiments for execution of the present invention will be described below with reference to the figures.

(First Embodiment)

Figure 1:
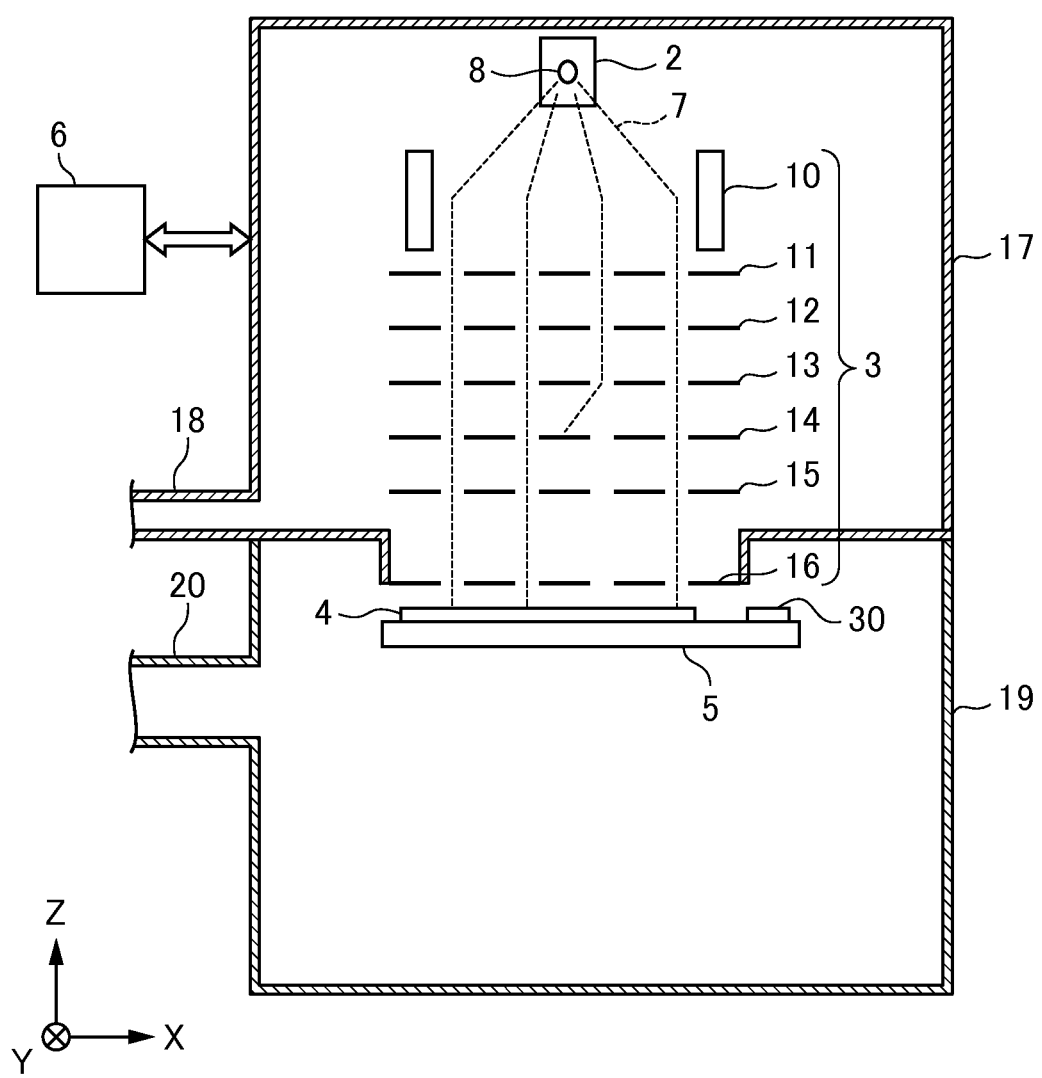
FIG. 1 illustrates a configuration of a rendering apparatus according to a first embodiment of the present invention.

Firstly, the charged particle beam apparatus according to the first embodiment of the present invention will be described. In particular, the charged particle beam apparatus according to the present embodiment is configured as a rendering apparatus that adopts a multi method for rendering of predetermined drawing data to a predetermined location by executing deflection (scanning) of a plurality of electron beams (charge particle beams) and separate controlling the blanking (irradiation OFF) of the respective electron beams. Here, there is no limitation on the charged particle beam to the electron beam used in the present embodiment, and another configuration of a charged particle beam such as an ion line (ion beam) or the like may be used. FIG. 1 is a schematic figure illustrating the configuration of a rendering apparatus 1 according to the present embodiment. In each of the following figures, the radiation direction of the electron beam relative to the substrate (body to be processed) 4 is configured on the Z axis, and the X axis and the Y axis are mutually orthogonal to a plane perpendicular to the Z axis. The rendering apparatus 1 includes an electron source 2, an electron optical system 3, a substrate stage 5 configured to hold the substrate 4, and a control unit 6. The substrate 4 is a wafer that is configured from monocrystalline silicon or the like, and a resist that exhibits light sensitive properties is coated on the surface thereof.

The electron source (charged particle source) 2 is a mechanism that emits an electron beam 7 by application of heat or an electrical field. In the figure, the dotted line indicates the orbit of the electron beam 7 that diverges from a crossover 8. The electron optical system 3 suitably deflects and focuses the electron beam 7 emitted from the electron source 2 for guidance onto the substrate 4. When viewed from the electron source 2, the electron optical system 3 includes a collimator lens 10, an aperture lens 11, a first electrostatic lens array 12, a blanking deflector array 13, a stopping aperture array 14, a deflector array 15, and a second electrostatic lens array 16. The collimator lens 10 is an electromagnetic lens that configures the electron beam 7 diverging at the crossover 8 into parallel beams. The aperture array 11 includes a plurality of circular apertures that are disposed in series in a matrix configuration, and divides the electron beam 7 that is incident from the collimator lens 10 into a plurality of beams. The first electrostatic lens array 12 is an electron lens (charged particle lens) that is configured by three electrode plate layers (in the figure, the three electrode plate layers are shown in an integrated configuration) that have a plurality of circular apertures disposed in series in a matrix configuration, and that focuses the electron beam 7 onto the stopping aperture array 14. The blanking deflector array 13 and the stopping aperture array 14 execute an operation to place the irradiation of the electron beam 7 ON (non-blanking state) or OFF (blanking state). The blanking deflector array 13 includes a plurality of blanking deflectors corresponding to the respective positions of the apertures above. The stopping aperture array 14 is disposed at a position at which the crossover of the electron beam 7 is initially formed by the first electrostatic lens array 12. The deflector array 15 deflects the image on the surface of the substrate, that is mounted on the substrate stage 5, in the X axis direction. Furthermore, the second electrostatic lens array 16 is an electron lens configured by three electrode plate layers in the same manner as the first electrostatic lens array 12, and focuses the electron beam 7 after passing through the stopping aperture array 14 onto the substrate 4.

The substrate stage (holder) 5 holds the substrate 4 for example with an electrostatic force, and is configured to displace at least in the XY axial direction. The position is measured in real time by use of an interferometer (laser measuring device) (not illustrated). In particular, the substrate stage 5 according to the present embodiment includes a radiation source 30 configured to radiate a radiant ray such as a soft X-ray onto the surface onto which the electron beam 7 is incident. The details of the radiation source 30 will be described below.

The control unit 6 consists of, for example, a computer or the like and is connected through a circuit to each constituent element of the rendering apparatus 1 to thereby execute control of each constituent element according to a program or the like. For example, when rendering a pattern, the control unit 6 executes continuous scanning of the substrate 4 in the Y axis direction by driving the substrate stage 5. At this time, the deflector array 15 executes suitable deflection in the X direction of the image on the surface of the substrate 4 with reference to the measurement result of the substrate stage 5 from the interferometer. The blanking deflector array 13 executes suitable control of the OFF position of the irradiation of the electron beam 7 to thereby obtain a target beam amount on the substrate 4. In this manner, the rendering apparatus 1 can form a desired latent image pattern on the resist of the substrate 4. In particular, the control unit 6 according to the present embodiment controls at least the operation of the radiation source 30 in addition to control during rendering as described above. The control unit 6 may be configured as an integrated body (in a common housing) with other portions of the rendering apparatus 1, or may be configured separately (separate housing) to the other portions of the rendering apparatus 1.

The electron beam 7 has the property of immediately becoming attenuated in an atmosphere at atmospheric pressure. Therefore, the rendering apparatus 1 includes the electron source 2 and the electron optical system 3 to prevent electrical discharge resulting from a high voltage, and includes an electron optical system barrel (vacuum container) 17 of which an inner portion is vacuum states during rendering processing. The inner portion of the electron optical system barrel 17 is held at a high vacuum level for example of no more than $10^{-5}$ Pa through a first discharge port 18 by the vacuum evacuation system (not illustrated). Furthermore, the rendering apparatus 1 includes a stage chamber 19 that is connected to the electron optical system barrel 17 and contains the substrate stage 5. The level of the vacuum in the stage chamber 19 is created by vacuum evacuation through the second discharge port 20 by a separate vacuum evacuation system that is independent of the vacuum evacuation system described above. However, the vacuum level may be set lower than the vacuum level of the inner portion of the electron optical system barrel 17. Furthermore, in the present embodiment, although the inner pressure between the electron optical system barrel 17 and the stage chamber 19 is different, the same inner pressure may be configured by a single vacuum evacuation system.

Next, the radiation source 30 disposed in the rendering apparatus 1 will be described. The inner portion of the stage chamber 19 and the electron optical system barrel 17 is maintained to a vacuum state as described above during normal rendering processing. In contrast, during maintenance, the inner portion of the stage chamber 19 and the electron optical system barrel 17 is during exposure to atmosphere. During exposure to atmosphere, it is normal to introduce dry nitrogen, dry air or a gas such as a noble gas into the inner portion to suppress mixing of moisture. The electron lens such as the first electrostatic lens array 12 or the second electrostatic lens array 16 contained in the electronic optical system 3 is configured to respectively three electrode plates, and these electrode plates are fixed in a formation that sandwiches the respective spacers formed from the insulating bodies. Therefore, when the gas is introduced into the inner portion of the electron optical system barrel 17 during exposure to the atmosphere as described above, the insulating spacer is charged by friction with the introduced gas and the resulting static electricity tends to cause attachment of particles. When the attachment of particles in this manner is produced in proximity to the orbit of the electron beam 7, in particular, near to the apertures of the respective electrostatic lens arrays 12 and 16, accurate rendering is difficult due to bending of the orbit or covering of the orbit of the electron beam 7. Furthermore, even when not during exposure to atmosphere, for example, when maintenance is completed and then the inner portion of the electron optical system barrel is again subjected to vacuum evacuation, there is a possibility that the insulating spacers described above are charged by reason of friction with the gas that is evacuated. In this case, there is the possibility that the resulting electrostatic electricity will have a direct effect on the orbit of the electron beam 7 during subsequent rendering processing. Therefore, in the present embodiment, when the air pressure in the inner portion of the electron optical system barrel 17 changes during evacuation or during exposure to atmosphere, the use of a radiation source 30 enables suppression of the production of electrostatic electricity in proximity to the aperture of the inner portion of the electronic optical system 3 (in proximity to the pathway of the electron beam 7).

Figure 2:
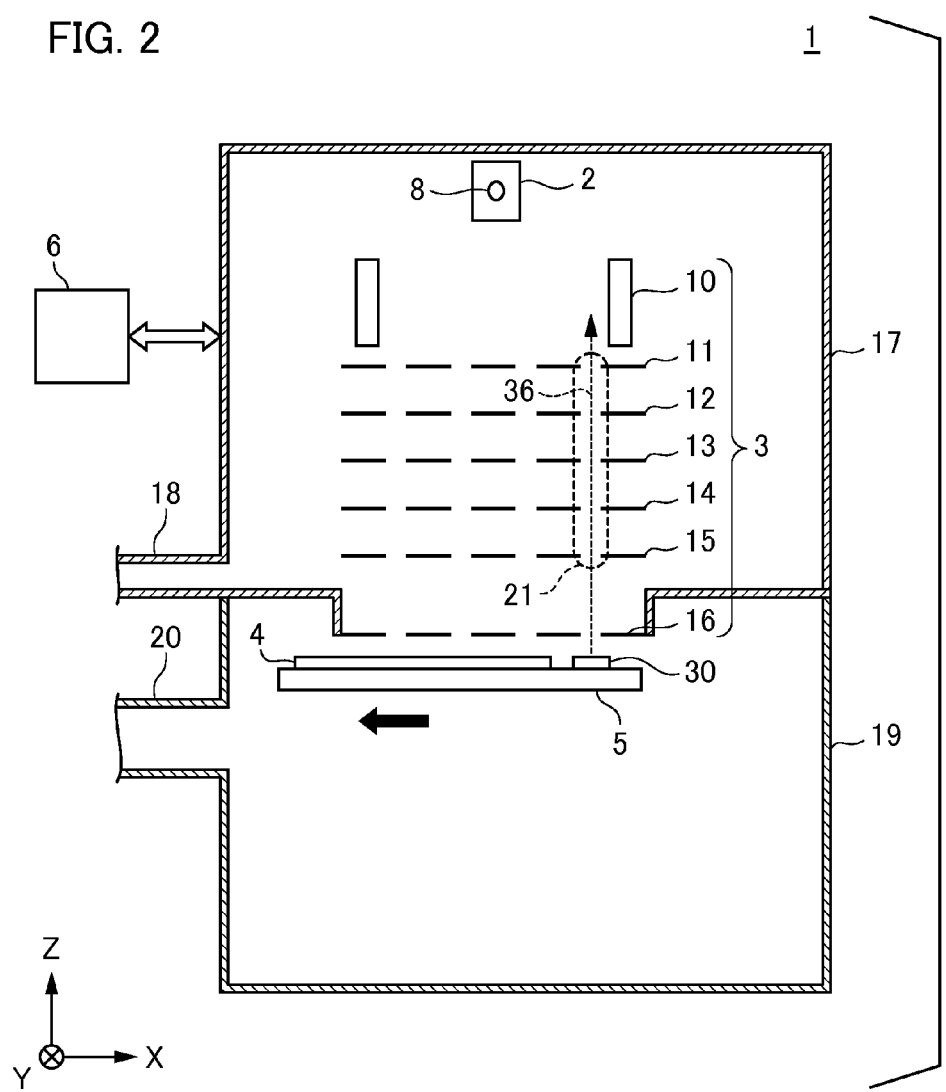
FIG. 2 illustrates an operating state of the radiation source during exposure to atmosphere or during evacuation.

Firstly, the configuration of the radiation source 30 according to the present embodiment will be described. FIG. 2 corresponds to FIG. 1 and is a schematic diagram describing the operating state of the radiation source 30 during evacuation and during exposure to atmosphere. The radiation source 30 as described above is disposed on the incident surface of the substrate stage 5 for the electron beam 7. More specifically, the radiating surface of the radiation source 30 is disposed to allow passage of the radiant beams 36 to the aperture array (the passage region of a given electron beam 7) 21 in the electronic optical system 3 during exposure to atmosphere or during evacuation of the electron optical system barrel 17. That is to say, during rendering processing, the control unit 6 refuges the radiation source 30 from the radiation position of the electron beam 7 by driving the substrate stage 5. On the other hand, during exposure to atmosphere, the control unit 6 displaces the radiation source 30 to a position immediately under a given aperture array (may include a plurality of aperture arrays) 21 as illustrated in FIG. 2 by moving the substrate stage 5 and thereby places the radiation source 30 in the ON position. Since the radiation source 30 moves in response to the movement of the substrate stage 5 as described above, it is preferred to adjust the height in advance when the substrate stage 5 moves to thereby avoid contact with the second electrostatic lens array 16 that is disposed in close proximity to the substrate stage 5 in the electronic optical system 3.

In particular, in the present embodiment, the radiant beam 36 from the radiation source 30 is soft X-rays. When soft X-rays are irradiated into a gas such as air, nitrogen, oxygen, or carbon dioxide, or the like, a portion of the gas becomes ionized and produces ions. These ions neutralize the charge upon contact with the surface or the like of the charged insulating body, and as a result, enable removal of the charge. The soft X-rays in the present embodiment denote an electromagnetic wave having a wavelength of 0.1 nm to 50 nm. The soft X-rays are radiated from the radiation source 30, and then have the property of linear propagation. Therefore as illustrated in FIG. 2, the soft X-rays pass through the immediately proximate aperture of the second electrostatic lens array 16 and tend to approach the aperture of the first electrostatic lens array 12 in the next stage. When adopting use of soft X-rays in the above manner, the radiation source 30 may be configured as a vacuum tube including a filament, a grid, a target thin film, and a window for transmission of the soft X-rays. The radiant rays 36 that are produced by the radiation source 30 are not limited to soft X-rays, and may be configured as other types of ionizing radiations (radiant rays that have an ionizing effect). Here, an ionizing radiation includes an alpha ray, a deuteron ray, a proton ray, a beta ray, and electron ray, a neutron ray, a gamma ray or an X-ray. Also, soft X-rays are included in such ionizing radiations. Furthermore, some ultraviolet rays having a short wavelength such as vacuum ultraviolet rays (electromagnetic rays having a wavelength in the range of 50 nm to 200 nm) or the like have an ionizing effect and are included in ionizing radiations.

Figure 3:
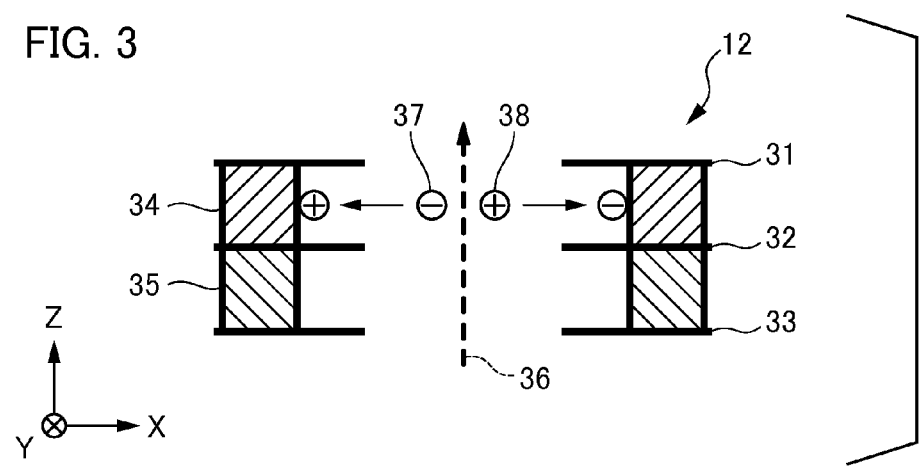
FIG. 3 illustrates the configuration at the aperture of an electrostatic lens array during passage of a soft X-ray.

A detailed description of the configuration when soft X-rays emitted from the radiation source 30 pass through the respective apertures of the first electrostatic lens array 12 and the second electrostatic lens array 16 will be given. FIG. 3 is a schematic sectional view of the configuration of aperture of the first electrostatic lens array 12 during transmission of the soft X-rays. In FIG. 3, although an enlarged example is given of one aperture disposed in the first electrostatic lens array 12, the second electrostatic lens array 16 is the same. The first electrostatic lens array 12 includes three porous electrode plates (first electrode 31, second electrode 32 and third electrode 33). A voltage V1, V2, and V3 is applied in sequence from the first electrode 31 to the third electrode 33, and thereby the first electrostatic lens array 12 has a function as an electrostatic lens by suitable maintenance of the relationship between the voltages. For example, when the voltage V1 and the voltage V3 are configured as the GND potential, and the voltage V2 is configured as the negative potential, the first electrostatic lens array 12 is an einzel electrostatic lens. As illustrated in FIG. 3, the first electrode 31 and the second electrode 32 are connected through the first insulating spacer 34, and on the other hand, the second electrode 32 and the third electrode 33 are connected through the second insulating spacer 35. The shape of the respective insulating spacers 34, 35 when viewed from the upper surface of the Z direction is an arcuate structure centered on the aperture formed in each of the electrodes 31, 32, 33. Since the first electrostatic lens 12 has this type of structure, when the soft X-rays emitted from the radiation source 30 pass through the aperture, an interaction occurs with the gaseous that is present in proximity to the aperture, and ions 37, 38 are produced. As described above, when the surface of the respective insulating spacers 34, 35 is charged during exposure to atmosphere or during evacuation, the ions 37, 38 are attracted and finally induce an electrical neutralization of the surface of the respective insulating spacers 34, 35. Therefore, the charge (production of electrostatic electricity) on the surface of the respective insulating spacers 34, 35 that is produced during exposure to atmosphere or during evacuation, is inhibited. When simultaneous passage of the soft X-rays into all of the aperture array 21 disposed in the electronic optical system 3 is not possible, the control unit 6 may enable passage of soft X-rays into each aperture array (or a group including a plurality of aperture arrays) 21 in sequence by suitable displacement of the substrate stage 5 in the XY plane.

In this manner, the rendering apparatus 1 inhibits a charge in the detailed portion in proximity to the apertures of the first electrostatic lens array 12 and the second electrostatic lens array 16, and in particular, on the surface of the respective insulating spacers 34, 35. In particular, when soft X-rays are emitted during evacuation of the electron optical system barrel 17, it is possible to suppress a direct effect on the orbit of the electron beam 7 as a result of electrostatic electricity during subsequent rendering processing, and to maintain superior rendering performance. Furthermore, in addition to vacuum evacuation, since it is possible to suppress attachment of particles to the surface of the respective insulating spacers 34, 35 by emitting soft X-rays also during exposure to atmosphere, it is possible to suppress an effect on the orbit of the electron beam 7 resulting from the particles. In addition, the radiation source 30 emitting such soft X-rays is disposed on the substrate stage 5, and therefore there is no requirement to add a drive mechanism or the like for separate displacement of the radiation source 30. Therefore, the rendering apparatus 1 exhibits the advantage of reducing the space for disposition of the mechanism for suppressing a charge in an internal portion and reduces the overall apparatus cost.

In this manner, the present embodiment provides a charged particle beam apparatus that is useful for neutralization of a charge on an insulating body that is included in an electron lens.

(Second Embodiment)

Figure 4:
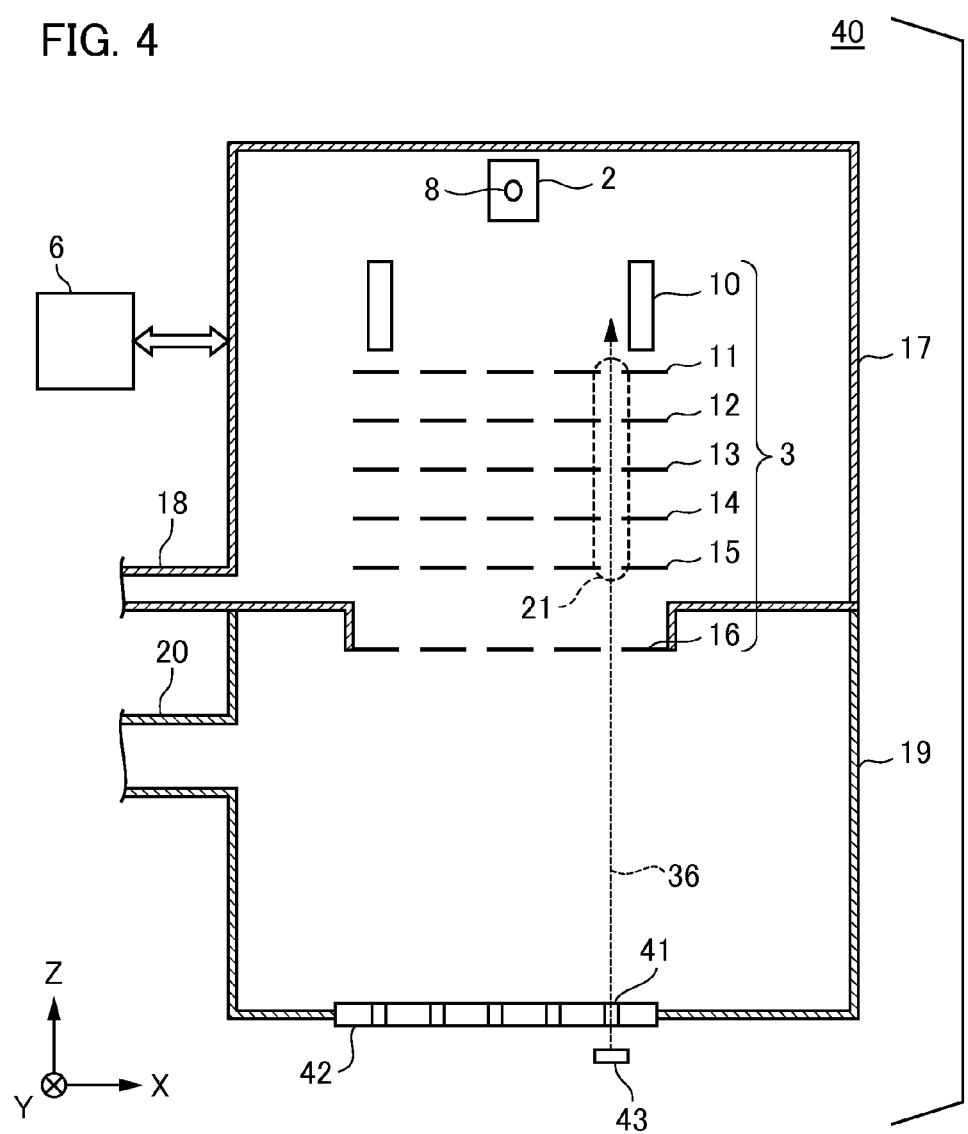
FIG. 4 illustrates a configuration of a rendering apparatus according to a second embodiment of the present invention.
Figure 5:
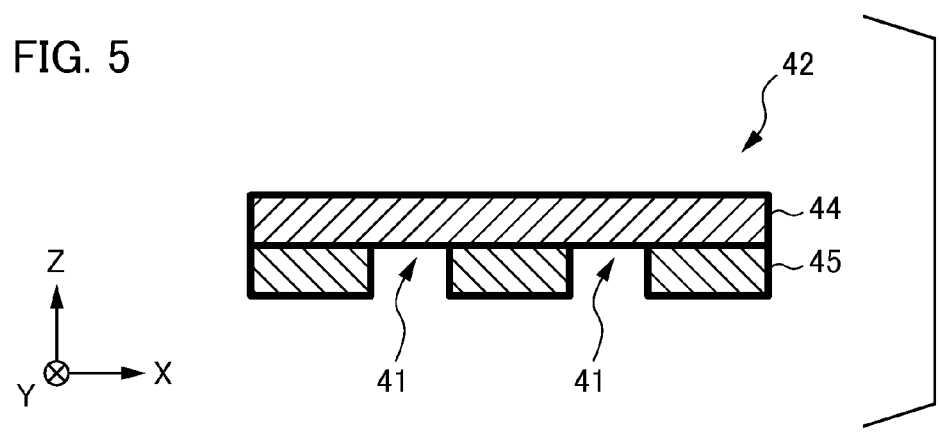
FIG. 5 illustrates a configuration of a transmission plate according to the second embodiment.

Next, the charged particle beam apparatus according to a second embodiment of the present invention will be described. The characteristic features of the charged particle beam apparatus according to this embodiment is the point that the radiation source that is equivalent to the radiation source 30 in the rendering apparatus 1 according to the first embodiment is not disposed on the surface of the substrate stage 5, but rather is disposed on an external portion of the stage chamber 19. FIG. 4 illustrates a configuration of a rendering apparatus 40 according to a second embodiment of the present invention that corresponds to the rendering apparatus 1 according to the first embodiment illustrated in FIG. 1. In FIG. 4, disclosure is omitted in relation to the feature that the substrate stage 5 displaces from the illumination region of the electron beam 7 and is placed in a refuged configuration. In this case, the stage chamber 19 includes a transmission plate (transmission portion) 42 that includes a plurality of windows 41 corresponding to the position of the plurality of aperture arrays 21 disposed in the electronic optical system 3 on the bottom surface corresponding to the illumination region of the electron beam 7 in the X axis direction. The radiation source 43 is disposed in proximity to the transmission plate 42 so that the soft X-rays propagate through the window 41 towards the aperture array 21 disposed in the electronic optical system 3. FIG. 5 is a schematic sectional figure illustrating an example of the configuration of the transmission plate 42. The transmission plate 42 may be configured by attaching a single beryllium plate 44 for example to the stage chamber 19 as a constituent member for the window 41. In this case, the beryllium plate 44 regulates the position of the plurality of the windows 41 by disposing a metal plate (for example, a punching metal) that includes a plurality of holes on an outer surface. The metal plate 45 is attached by adhesion to the beryllium plate 44 to thereby prevent damage to the beryllium plate 44 caused by impacts or the like.

Since the rendering apparatus 40 has this configuration, during exposure to atmosphere or during evacuation of the electron optical system barrel 17 in the same manner as the description for the first embodiment, the control unit 6 firstly refuges the substrate stage 5 from the illumination region of the electron beam 7 and causes the radiation source 43 to emit soft X-rays (radiant beams 36). At this time, a configuration is also possible in which the soft X-rays from the radiation source 43 cannot pass simultaneously from all the windows 41 disposed on the transmission plate 42. In this case, the rendering apparatus 40 includes a separately disposed drive mechanism to enable movement of the radiation source 43 in the XY plane. The control unit 6 may cause passage of soft X-rays in each of the windows 41 (or a group including a plurality of windows 41) in sequence by suitable displacement of the drive mechanism. The present embodiment obtains the same effect as the first embodiment and is useful in relation to the situation in which space for installation of the radiation source on the substrate stage 5 is not available. Furthermore, there are difficulties related to installation of the radiation source on the substrate stage 5 when using a large output radiation source. In this regard, since the present embodiment enables use of a large output radiation source that has a large outer shape, more effective charge suppression is enabled.

(Third Embodiment)

Figure 6:
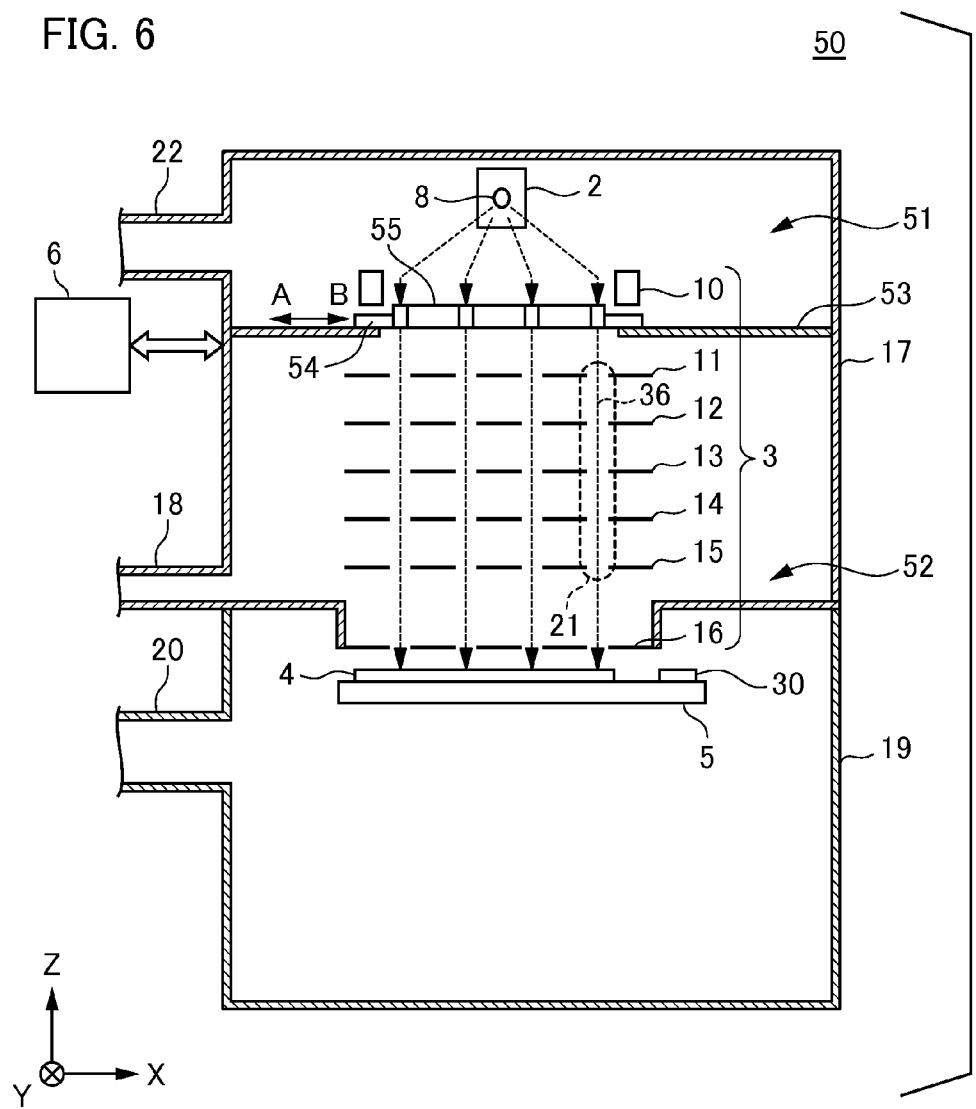
FIG. 6 illustrates a configuration of a rendering apparatus according to a third embodiment of the present invention.
Figure 7:
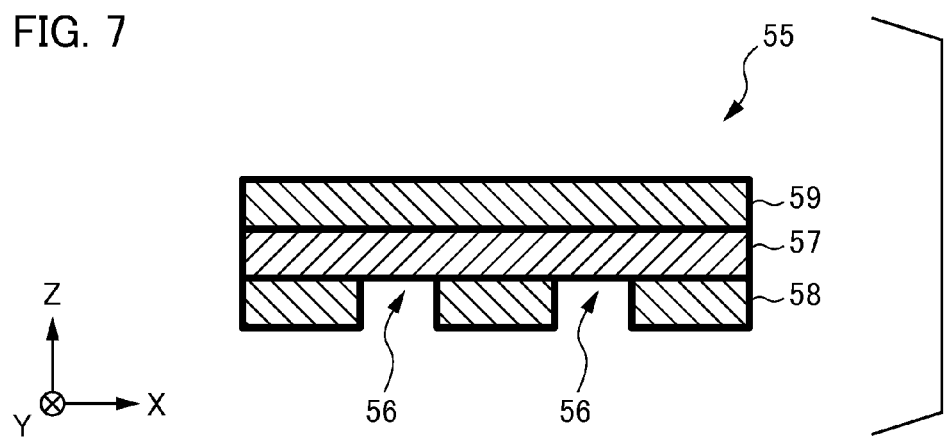
FIG. 7 illustrates a configuration of a transmission plate according to the third embodiment.

Next, the charged particle beam apparatus according to a third embodiment of the present invention will be described. The characteristic feature of the charged particle beam apparatus according to this embodiment is the point that a radiation source that is similar to the radiation source 30 in the rendering apparatus 1 according to the first embodiment is disposed in a gate valve disposed on a partitioning portion between the collimator lens 10 and the aperture array 11 in the electron optical system barrel 17. FIG. 6 is a schematic view illustrating a configuration of a rendering apparatus 50 according to the present embodiment that corresponds to the rendering apparatus 1 according to the first embodiment illustrated in FIG. 1. Firstly, the rendering apparatus 50 includes a partition 53 that separates the internal space of the electron optical system barrel 17 into a first space 51 that includes the electron source 2 and a second space 52 that includes the electronic optical system 3 below the aperture array 11. The partition 53 includes a gate valve 54 configured to open and close to thereby enable communication between the first space 51 and the second space 52. The gate valve 54 includes a transmission plate (transmission portion) 55 disposed in relation to a target that is the radiation source in the present embodiment. FIG. 7 is a schematic sectional view that illustrates an example of a configuration of the transmission plate 55. The transmission plate 55 may be configured by a beryllium plate 57 as a constituent member for the plurality of windows 56 corresponding to the windows 41 in the second embodiment and a metal plate (for example, a punching metal) 58 that is attached by adhesion to the beryllium plate 57 and includes a plurality of holes on an outer surface. The feature of regulation by the metal plate 58 of the position of the plurality of windows 56 corresponding to the plurality of aperture arrays 21 disposed in the electronic optical system 3 is the same as the second embodiment. Furthermore the transmission plate 55 includes a tungsten film 59 as a target on the surface of the beryllium plate 57 near to the electron source 2.

Since the rendering apparatus 50 has this configuration, during rendering processing, the control unit 6 causes displacement and refuging of the gate valve 54 in the direction A in FIG. 6 to thereby place the first space 51 and the second 52 in communication. In contrast, during exposure to atmosphere or during evacuation of the electron optical system barrel 17 in the same manner as described in relation to the first embodiment, the control unit 6 displaces the gate valve 54 in the direction B in FIG. 6 to thereby separate the first space 51 and the second space 52 as illustrated in FIG. 6. Next, the control unit 6 uses a vacuum evacuation system to execute vacuum evacuation of the first space 51 through the third discharge port 22, and causes the electron source 2 to execute illumination with the electron beam 7 in the same manner as during normal rendering processing to thereby bring the electron beam 7 into contact with the tungsten film 59 on the transmission plate 55. In this manner, since the tungsten film 59 undergoes excitation and emits soft X-rays in an outward orientation, the direction of radiation of soft X-rays 60 that is regulated by the plurality of windows 56 is orientated towards the aperture array 21 disposed in the electronic optical system 3 as illustrated in FIG. 6. According to the present embodiment, the same effect as the first embodiment is obtained, and since the tungsten film 59 acts as a radiation source to radiate soft X-rays by use of the existing electron source 2, there is no requirement to provide a radiation source as in the first and the second embodiment. Furthermore, since there is no requirement for suitable displacement of the radiation source when emitting soft X-rays as in the first and the second embodiments, a drive mechanism for that purpose is not required. Therefore, further cost reductions are enabled in relation to the overall rendering apparatus.

The charged particle beam apparatus according to the present embodiment has been described in relation to a multi-type rendering apparatus that uses a plurality of electron beams 7. However application is also possible to a rendering apparatus that uses a single electron beam. Furthermore, the emission of soft X-rays that has been described in each of the above embodiments may be executed on each occasion the electron optical system barrel 17 is during exposure to atmosphere or undergoes vacuum evacuation. For example, execution may be performed when detecting that there has been a change in the orbit of the electron beam 7 in a series of (a plurality of) rendering processes. In addition, in the description of the radiation source in the above embodiment, although no particular description has been provided due to the linear propagation of soft X-rays, the illumination efficiency in relation to the aperture arrays 21 of the electron optical system 3 may be further improved by a configuration that includes a collimator on the emission surface of the radiation source. Furthermore, a configuration is possible in which a condenser that includes a mirror for reflecting the ionizing radiations (or vacuum ultraviolet light) emitted from the radiation source is separately provided on the periphery of the condenser. Therefore this configuration enables effective suppression of a charge since the ionizing radiations are focused on the aperture array 21.

Other Embodiments

Next, a method of manufacturing a device (semiconductor device, liquid crystal display device, etc.) as an embodiment of the present invention is described. The semiconductor device is manufactured through a front-end process in which an integrated circuit is formed on a wafer, and a back-end process in which an integrated circuit chip is completed as a product from the integrated circuit on the wafer formed in the front-end process. The front-end process includes a step of exposing a wafer coated with a photoresist to light using the above-described exposure apparatus of the present invention, and a step of developing the exposed wafer. The back-end process includes an assembly step (dicing and bonding), and a packaging step (sealing). The liquid crystal display device is manufactured through a process in which a transparent electrode is formed. The process of forming a plurality of transparent electrodes includes a step of coating a glass substrate with a transparent conductive film deposited thereon with a photoresist, a step of exposing the glass substrate coated with the photoresist thereon to light using the above-described exposure apparatus, and a step of developing the exposed glass substrate. The device manufacturing method of this embodiment has an advantage, as compared with a conventional device manufacturing method, in at least one of performance, quality, productivity and production cost of a device.

(Article Manufacturing Method)

An article manufacturing method according to an embodiment of the present invention is preferred in, for example, manufacturing a micro device, such as a semiconductor device or the like or an article such as an element or the like having a microstructure. The article manufacturing method may include the step of forming a latent image pattern on a substrate on which a photosensitizing agent is coated using the aforementioned drawing apparatus (a step of drawing a pattern on a substrate); and developing the substrate on which the latent image pattern has been formed in the latent image pattern step. Furthermore, the article manufacturing method may include other known steps (oxidizing, film forming, vapor depositing, doping, flattening, etching, resist peeling, dicing, bonding, packaging, and the like). The article manufacturing method of the present embodiment has an advantage, as compared with a conventional article manufacturing method, in at least one of performance, quality, productivity and production cost of an article.

While the embodiments of the present invention have been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-034066 filed Feb. 20, 2012 which is hereby incorporated by reference herein in its entirety.

What is claimed is:

1. A charged particle beam apparatus for processing an object using a charged particle beam, the apparatus comprising:
    a charged particle optical element in which an array of apertures, through each of which a charged particle beam passes, is formed;
    a vacuum container which contains the charged particle optical element; and
    a radiation source configured to generate an ionizing radiation,
    wherein the apparatus is configured to cause the radiation source to pass the ionizing radiation through the array of apertures to irradiate a gas in the vacuum container with the ionizing radiation in a state in which a pressure in the vacuum container is changing.

2. The apparatus according to claim 1, wherein the radiation source is configured to generate, as the ionizing radiation, at least one of soft X-ray and vacuum ultraviolet light.

3. The apparatus according to claim 2, further comprising:
    a holder configured to hold the object and to be movable, wherein the holder includes the radiation source.

4. The apparatus according to claim 2, wherein the vacuum container includes a transmission portion configured to transmit the ionizing radiations, and
    wherein the radiation source is disposed outside the vacuum container, and is configured to pass the ionizing radiation through the array of apertures via the transmission portion.

5. The according to claim 4, further comprising a drive mechanism configured to move the radiation source.

6. The apparatus according to claim 1, further comprising:
    a holder configured to hold the object and to be movable, wherein the holder includes the radiation source.

7. The apparatus according to claim 1, wherein the vacuum container includes a transmission portion configured to transmit the ionizing radiation, and
    wherein the radiation source is disposed outside the vacuum container, and is configured to pass the ionizing radiation through the array of apertures via the transmission portion.

8. The apparatus according to claim 7, further comprising a drive mechanism configured to move the radiation source.

9. The apparatus according to claim 1, further comprising:
    a charged particle beam source configured to generate the charged particle beam,
    wherein the radiation source is configured to generate the ionizing radiation with the charged particle beam generated by the charged particle beam source.

10. The apparatus according to claim 1, wherein the apparatus is configured to perform drawing on the object with the charged particle beam.

11. The apparatus according to claim 1, wherein the apparatus is configured to cause the radiation source to pass the ionizing radiation through the array of apertures to irradiate the gas in the vacuum container with the ionizing radiation in the state in which the pressure in the vacuum container is changing between a vacuum in which the processing is performed and an atmosphere pressure in which the processing is not performed.

12. A method of manufacturing an article, the method comprising:
    performing drawing on an object using a charged particle beam apparatus;
    developing the object on which the drawing has been performed; and
    processing the developed object to manufacture the article,
    wherein the charged particle beam apparatus performs the drawing on the object with a charged particle beam, the apparatus comprising:
        a charged particle optical element in which an array of apertures, through each of which a charged particle beam passes, is formed;

a vacuum container which contains the charged particle optical element; and a radiation source configured to generate an ionizing radiation, wherein the apparatus is configured to cause the radiation source to pass the ionizing radiation through the array of apertures to irradiate a gas in the vacuum container with the ionizing radiation in a state in which a pressure in the vacuum container is changing.

13. A charged particle beam apparatus for processing an object using a charged particle beam, the apparatus comprising:

a charged particle optical element in which an aperture, through which the charged particle beam passes, is formed;

a vacuum container which contains the charged particle optical element; and a radiation source configured to generate an ionizing radiation, wherein the apparatus is configured to cause the radiation source to irradiate a gas in the vacuum container with the ionizing radiation in a state in which a pressure in the vacuum container is changing.

14. The apparatus according to claim 13, wherein the apparatus is configured to cause the radiation source to irradiate the gas in the vacuum container with the ionizing radiation in the state in which the pressure in the vacuum container is changing between a vacuum in which the processing is performed and an atmosphere pressure in which the processing is not performed.

15. A method of manufacturing an article, the method comprising:

performing drawing on an object using a charged particle beam apparatus;

developing the object on which the drawing has been performed; and processing the developed object to manufacture the article, wherein the charged particle beam apparatus performs the drawing on the object using a charged particle beam, and includes:

a charged particle optical element in which an aperture, through which the charged particle beam passes, is formed;

a vacuum container which contains the charged particle optical element; and a radiation source configured to generate an ionizing radiation, wherein the apparatus is configured to cause the radiation source to irradiate a gas in the vacuum container with the ionizing radiation in a state in which a pressure in the vacuum container is changing.

* * * * *